(12) United States Patent
Gole et al.

(10) Patent No.: US 6,720,240 B2
(45) Date of Patent: Apr. 13, 2004

(54) SILICON BASED NANOSPHERES AND NANOWIRES

(75) Inventors: James L. Gole, Atlanta, GA (US); John D. Stout, Atlanta, GA (US); Mark G. White, Woodstock, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 53 days.

(21) Appl. No.: 09/820,413

(22) Filed: Mar. 29, 2001

(65) Prior Publication Data

US 2002/0001977 A1 Jan. 3, 2002

Related U.S. Application Data

(60) Provisional application No. 60/192,846, filed on Mar. 29, 2000, and provisional application No. 60/192,844, filed on Mar. 29, 2000.

(51) Int. Cl.$^7$ .................. H01L 21/20; H01L 21/4763
(52) U.S. Cl. .................. 438/487; 438/618; 438/623; 438/931; 438/940; 438/962
(58) Field of Search .................. 438/618, 962, 438/487, 940, 931, 623

(56) References Cited

U.S. PATENT DOCUMENTS

| | | | | |
|---|---|---|---|---|
| 5,783,498 A | * | 7/1998 | Dotta | 438/778 |
| 5,801,092 A | * | 9/1998 | Ayers | 438/623 |
| 5,937,313 A | * | 8/1999 | Kang | 438/478 |
| 5,976,957 A | * | 11/1999 | Westwater et al. | 438/478 |

(List continued on next page.)

OTHER PUBLICATIONS

R.C. Salvarezza et al., Edward–Wilkinson Behavior of crystal Surfaces Grown by Sedimentation of SiO2 Nanoshperes, 1996, Physical review letters, vol. 77, No. 22, Nov. 25, 1996 pp. 4572–4575.*

P.B. MirKarimi et al., Investigating the growth of localized defects in thin films using gold nanospheres, Applied Physics Letters, vol. 77 No. 14, Oct. 2001 pp. 2343–2245.*

P.B. Mirkarimi et al., Quantum Electronics Letters, IEEE Journal Of Quantum Electronics, vol. 37, No. 12, Dec. 2001.*

Gole, Stout, Rauch, Wang; Direct synthesis of silicon nanowires, silica nanospheres, and wire–like nanosphere agglomerates; Applied Physics Letters, vol. 76, No. 17, Apr. 24, 2000, pp. 2346–2348.

Hu, Odom, Lieber; Chemistry and Physics in One Dimension: Synthesis and Properties of Nanowires and Nanotubes, Acc. Chem. Res. 1999, vol. 32, No. 5, 1999, pp. 435–445.

Gole, White; Nanocatalysis: Selective Conversion of Ethanol to Acetaldehyde Using Monoatomically Dispersed Copper on Silica Nanospheres; Journal of Catalysis, pp. 2–15.

Crooks, Zhao, Sun, Chechik, Yeung; Dendrimer–Encapsulated Metal Nanoparticles: Synthesis, Characterization, and Applications to Catalysis; Accounts of Chemical Research, vol. 34, No. 3, Mar. 2001; pp. 181–189.

Kenvin and White; Supported Catalysts Prepared from Mononuclear Copper Complexes: Catalytic Properties; Journal of Catalysis; 1992; pp. 81–91.

*Primary Examiner*—Wael Fahmy
*Assistant Examiner*—Shrinivas H Rao

(57) ABSTRACT

A nanowire, nanosphere, metallized nanosphere, and methods for their fabrication are outlined. The method of fabricating nanowires includes fabricating the nanowire under thermal and non-catalytic conditions. The nanowires can at least be fabricated from metals, metal oxides, metalloids, and metalloid oxides. In addition, the method of fabricating nanospheres includes fabricating nanospheres that are substantially monodisperse. Further, the nanospheres are fabricated under thermal and non-catalytic conditions. Like the nanowires, the nanospheres can at least be fabricated from metals, metal oxides, metalloids, and metalloid oxides. In addition, the nanospheres can be metallized to form metallized nanospheres that are capable as acting as a catalyst.

9 Claims, 1 Drawing Sheet

U.S. PATENT DOCUMENTS

| | | | |
|---|---|---|---|
| 6,130,143 A | * 10/2000 | Westwater et al. | 438/478 |
| 6,143,211 A | * 11/2000 | Mathiowitz et al. | 264/4 |
| 6,235,224 B1 | * 5/2001 | Mathiowitz et al. | 264/4 |
| 6,268,041 B1 | * 7/2001 | Goldstein | 428/208 |
| 6,297,063 B1 | * 10/2001 | Brown et al. | 438/2 |
| 6,313,015 B1 | * 11/2001 | Lee et al. | 438/478 |
| 6,359,288 B1 | * 3/2002 | Ying et al. | 257/14 |
| 6,365,493 B1 | * 4/2002 | Vekris et al. | 438/558 |
| 6,461,528 B1 | * 10/2002 | Scherer et al. | 216/56 |
| 2001/0042932 A1 | * 11/2001 | Mathiowitz et al. | 264/4.1 |
| 2002/0175408 A1 | * 11/2002 | Majumdar et al. | 257/734 |

\* cited by examiner

SILICON BASED NANOSPHERES AND NANOWIRES

CROSS-REFERENCE TO RELATED APPLICATION

This application claims priority to copending U.S. Provisional application entitled, "Silicon Based Nanowires and Nanospheres", filed with the United States Patent and Trademark Office on Mar. 29, 2000, and assigned Ser. No. 60/192,846, and U.S. provisional application entitled "New Cu/SiO$_2$ Based Catalyst for Selective Ethanol-Acetaldehyde Conversion", filed with the United States Patent and Trademark Office on Mar. 29, 2000, and assigned Ser. No. 60/192,844, which are both entirely incorporated herein by reference.

TECHNICAL FIELD

The present invention is generally related to nanostructures and, more particularly, is related to nanowires and nanospheres and methods for their preparation and use.

BACKGROUND OF THE INVENTION

Semiconductor nanostructures, nanoagglomerates, and nanowires have attracted considerable attention because of their potential applications in mesoscopic research, the development of nanodevices, and the potential application of large surface area structures. For several decades, the vapor-liquid-solid (VLS) process, where gold particles act as a mediating solvent on a silicon substrate forming a molten alloy, has been applied to the generation of silicon whiskers. The diameter of the whisker is established by the diameter of the liquid alloy droplet at its tip. The VLS reaction generally leads to the growth of silicon whiskers epitaxially in the <111> direction on single crystal silicon <111> substrates. In addition, laser ablation techniques have been performed on metal-containing (iron or gold) silicon targets, producing bulk quantities of silicon nanowires. Further, thermal techniques have been used to produce a jumble of silicon dioxide (SiO$_2$) coated crystalline nanowires that have their axes parallel to the <112> direction. Further, these nanowires are deficient because of twinning, high order grain boundaries, and stacking faults.

Recently, national lab researchers, in an effort to begin an ongoing dialogue to forecast the direction of environmental science and technology, ranked the top ten environmental technology breakthroughs for 2008. Not surprisingly, molecular design is expected to play an important role in the development of advanced materials. Included in this framework is the design of nano-assembled and non-stoichiometric catalysts designed for the efficient control of chemical processes.

Heterogeneous catalysts are typically prepared by decorating high surface area solids such as silica or alumina with active metals or metal ions from precursor materials such as cation complexes [M$^{n+}$(L$^{m-}$$_x$)]$^{(n-xm)}$, anion complexes (e.g., [Pt$^{4+}$F$_6$]$^{2-}$ or neutrals such as copper (II) acetylacetonate (Cu(AcAc)$_2$)). These processes typically use starting reagents and produce products that are harmful to the environment (e.g. solvents, metal halides, strong acids, or other environmentally aggressive reagents and or products). A high-surface-area support is needed to provide the proper dispersion of the active ingredients so that the high intrinsic activity of these catalytic metals or ions can be realized in practice. Without this support, many catalytic agents show very little active surface area. Often, the intrinsic catalytic activity of the supported metals or metal ions is changed by interaction with the support metal ions or oxygen atoms. Thus, some supports are not benign towards the catalytic agents. Moreover, the catalytic properties of these agents are often compromised as a result of the efforts to synthesize supported catalysts having high dispersions of the active ingredient. These uniquely assembled catalysts might then be used to more efficiently control combustion processes, and reactions such as hydrocarbon reforming.

Thus, a heretofore unaddressed need exists in the industry to address the aforementioned deficiencies and inadequacies.

SUMMARY OF THE INVENTION

An embodiment of the present invention provides for a nanowire and method of fabrication thereof. The method includes fabricating the nanowires under thermal and non-catalytic conditions. The nanowires can be fabricated from at least metals, metal oxides, metalloids, and metalloid oxides. A preferred embodiment of the present invention includes, but is not limited to, the fabrication of a silicon dioxide sheathed crystalline silicon nanowire, where the axis of the crystalline silicon nanowire core is substantially parallel to a <111> plane and is substantially free of defects.

Another embodiment of the present invention provides for a nanosphere and method of fabrication thereof. The method includes fabricating the substantially monodisperse nanospheres under thermal and non-catalytic conditions. The nanospheres can at least be fabricated from metals, metal oxides, metalloids, and metalloid oxides. A preferred embodiment of the present invention includes, but is not limited to, fabricating amorphous silicon dioxide nanospheres.

Still another embodiment of the present invention provides for a metallized nanosphere and method of fabrication thereof. The method includes fabricating the subtantially monodisperse nanospheres under thermal and non-catalytic conditions. The nanospheres can be fabricated from at least metals, metal oxides, metalloids, and metalloid oxides. The nanospheres can be metallized to form metallized nanospheres that are capable of having catalytic properties. In addition, the formation of the nanospheres and metallization of the nanospheres can be performed substantially in one step. A preferred embodiment of the present invention includes fabricating amorphous silicon dioxide nanospheres and depositing three weight percent (%) copper onto the nanosphere.

Still a further embodiment of the present invention provides for a method of the dehydrogenation of ethanol. The method includes introducing gaseous ethanol to three weight percent metallized silicon dioxide nanospheres to produce at least a three percent conversion/mg copper for the selective dehydrogenation of ethanol into acetaldehyde.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components

DETAILED DESCRIPTION OF THE PREFERRED EMBODIMENT

Figure 1:
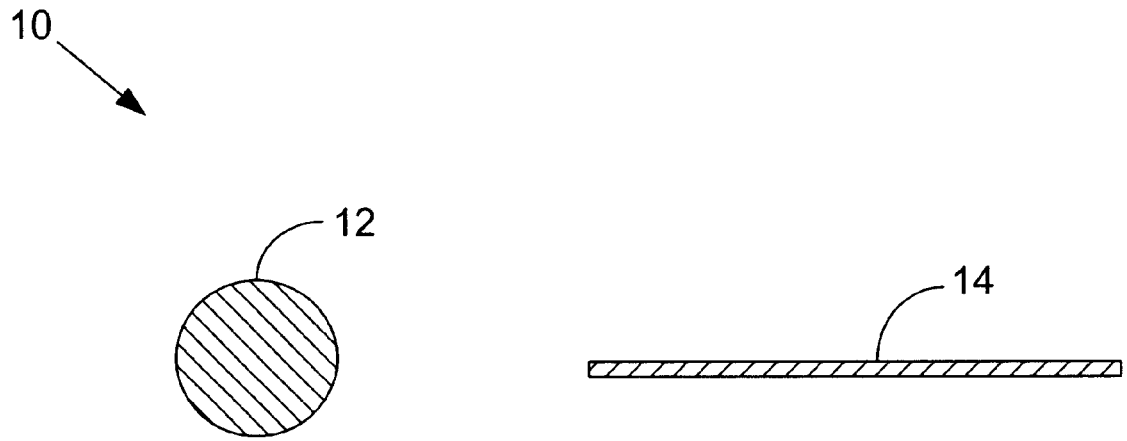
FIG. 1 illustrates a cross-sectional view of a representative embodiment of a nanosphere and a nanowire.
Figure 2:
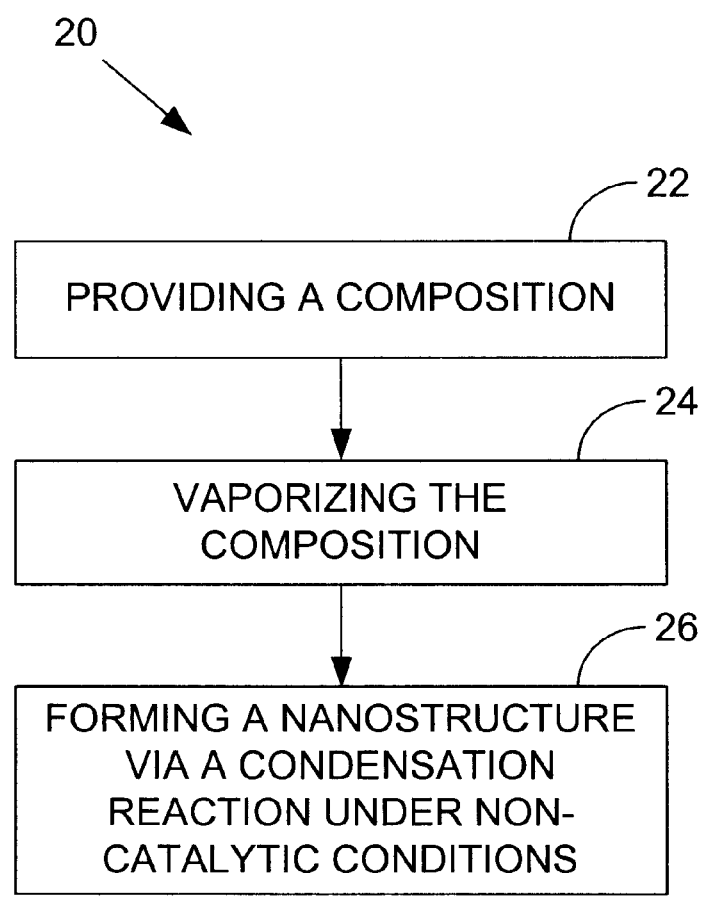
FIG. 2 illustrates a flow diagram of a method for producing of a nanostucture.

Embodiments of the present invention provide for nanostructures 10, catalytic nanostructures, and methods of preparation of same, as shown in FIGS. 1 and 2. Nanostructures 10 include, but are not limited to, nanowires 14, nanospheres 12, nanoagglomerates, nanotubes, etc. More specifically, exemplary embodiments of the present invention provide a nanowire 14 and methods of preparation thereof. Another exemplary embodiment provides a nanosphere 12 and methods of preparation thereof. Still another exemplary embodiment provides a catalytic nanosphere and methods of preparation thereof (e.g., a metallized nanosphere with catalytic activity). The nanostructures 10 can be made from materials such as, but not limited to, metals, metal oxides, metalloids, metalloid oxides, combinations of metals, combinations of metal oxides, combinations of metalloids, combinations of metalloid oxides, combinations of metals and metal oxides, combinations of metalloid and metalloid oxides, or any other appropriate combination. The nanostructures 10 can be made of materials such as, but not limited to, metal oxides and metalloid oxides. Further, the nanostructures 10 can be metallized to form catalytic nanostructures that can be used to enhance reaction kinetics and reaction efficiency.

A. Nanowires and Nanospheres

One exemplary embodiment of the present invention provides for a nanowire prepared under thermal and non-catalytic conditions. The thermal conditions include, but are not limited to, the range of 800° C. to 1500° C. The term non-catalytic conditions means, for the purposes of this disclosure, that an additional catalyst is unnecessary for the nanostructures to be fabricated. In an exemplary embodiment, the nanowire can be fabricated from metal, metal oxide, metalloid, metalloid oxide, or combinations thereof, to form metal oxide or metalloid oxide nanowires.

In a preferred embodiment, the nanowires include silicon dioxide sheathed crystalline silicon nanowires where the axis of the crystalline silicon nanowire core is substantially parallel to a <111> plane. In addition, the silicon nanowires are substantially defect free. That is, the silicon nanowires are substantially free of twinning, high order grain boundaries, and stacking faults.

Non-limiting examples of metals from which the nanowires can be fabricated include, but are not limited to, tin (Sn), chromium (Cr), iron (Fe), nickel (Ni), silver (Ag), titanium (Ti), cobalt (Co), zinc (Zn), platinum (Pt), palladium (Pd), osmium (Os), gold (Au), lead (Pb), iridium (Ir), molybdenum (Mo), vanadium (V), aluminum (Al), or combinations thereof. In addition, non-limiting examples of metal oxides from which the nanowires can be fabricated include, but not limited to, tin dioxide ($SnO_2$), chromia ($Cr_2O_3$), iron oxide ($Fe_2O_3$, $Fe_3O_4$, or FeO), nickel oxide (NiO), silver oxide (AgO), titanium oxide ($TiO_2$), cobalt oxide ($Co_2O_3$, $Co_3O_4$, or CoO), zinc oxide (ZnO), platinum oxide (PtO), palladium oxide (PdO), vanadium oxide ($VO_2$), molybdenum oxide ($MoO_2$), lead oxide (PbO), and combinations thereof. In addition, a non-limiting example of a metalloid from which the nanowire can be fabricated includes, but is not limited to, silicon or germanium. Further, a non-limiting example of a metalloid oxide from which the nanowire can be fabricated includes, but is not limited to, silicon monoxide, silicon dioxide, germanium monoxide, and germanium dioxide. The nanowire can be a metal oxide or metalloid oxide nanowire.

Another exemplary embodiment of the present invention provides for a plurality of nanospheres that are substantially monodisperse and a method of preparation thereof. In addition, the nanospheres can be fabricated in gram quantities under thermal and non-catalytic conditions. The thermal condition includes, but is not limited to, the range of 800° C. to 1500° C. The term non-catalytic conditions means that an additional catalyst is unnecessary for the nanostructures to be fabricated. Further, the nanospheres can be fabricated from, metal oxide, metalloid, metalloid oxide, or combinations thereof nanospheres.

Non-limiting examples of metals from which the nanospheres can be fabricated include, but are not limited to, tin (Sn), chromium (Cr), iron (Fe), nickel (Ni), silver (Ag), titanium (Ti), cobalt (Co), zinc (Zn), platinum (Pt), palladium (Pd), osmium (Os), gold (Au), lead (Pb), iridium (Ir), molybdenum (Mo), vanadium (V), aluminum (Al), and combinations thereof. In addition, non-limiting examples of metal oxides from which the nanospheres can be fabricated include, but not limited to, tin dioxide ($SnO_2$), chromia ($Cr_2O_3$), iron oxide ($Fe_2O_3$, $Fe_3O_4$, or FeO), nickel oxide (NiO), silver oxide (AgO), titanium oxide ($TiO_2$), cobalt oxide ($Co_2O_3$, $Co_3O_4$, or CoO), zinc oxide (ZrxO), platinum oxide (PtO), palladium oxide (PdO), vanadium oxide ($V0_2$), molybdenum oxide ($MoO_2$), lead oxide (PbO), and combinations thereof. In addition, a non-limiting example of a metalloid from which the nanospheres can be fabricated includes, but is not limited to, silicon and germanium. Further, a non-limiting example of a metalloid oxide from which the nanospheres can be fabricated includes, but is not limited to, silicon monoxide, silicon dioxide, germanium monoxide, and germanium dioxide.

In general the nanospheres can range in diameter from a few nanometers to on the order of hundreds of nanometers. More particularly, silicon dioxide nanospheres are amorphous, have no dangling bonds, and range in diameter from about 8–45 nanometers (nm). Further, the method of fabricating nanospheres and nanowires using thermal techniques can be similar. In this regard, both nanospheres and nanowires can be fabricated using similar fabrication steps. Modifications in fabrication parameters, disclosed hereinafter, can be used to control the quality and quantity of the fabricated nanospheres and nanowires.

EXAMPLE 1

For the purposes of illustration only, and without limitation, embodiments of the present invention will be described with particular reference to the below-described fabrication methods. Note that not every step in the process is described with reference to the process described in the figures hereinafter. Therefore, the following fabrication processes are not intended to be an exhaustive list that includes every step required to fabricate the embodiments of the nanostructures.

FIG. 2 illustrates a flow diagram of a representative method 20 for producing the nanostucture 10 (e.g., nanowires 12 and nanospheres 14). In block 22, at least one composition, such as those described above, is provided. In block 24, the composition is vaporized. In block 26, the nanostructure 10, such as those described above, is formed via a condensation reaction under non-catalytic conditions.

The following is a non-limiting illustrative example of an embodiment of the present invention that is described in more detail in Gole, et al., Appl. Phys. Lett., 76, 2346 (2000), which is incorporated herein by reference. This example is not intended to limit the scope of any embodiment of the present invention, but rather is intended to provide specific experimental conditions and results. Therefore, one skilled in the art would understand that many experimental conditions can be modified, but it is intended that these modification are within the scope of the embodiments of the present invention.

The apparatus to fabricate silicon based nanostructures includes a double concentric alumina tube combination that can be heated to the desired temperature in a Lindberg Scientific tube furnace configuration. The inner alumina tube is vacuum sealed by two water cooled stainless steel end pieces which are attached to the alumina tube and tightly lock-press fit against custom viton o-rings. At one end of the furnace, ultra-high purity argon (Ar) enters through the upstream stainless steel end piece and passes through a matched set of zirconia insulators to the central region of the inner tube oven. Here the entraining argon flows over a crucible containing the sample mixture of interest, which may be either a silicon-silica ($Si/SiO_2$) mixture or powdered silicon monoxide, at a flow rate of 100 standard cubic centimeter per minute (sccm) controlled by a flow controller. It should be noted that other sample mixtures can be used that correspond to the metals listed hereinabove.

The total tube pressure in the inner tube can range from 200 to 650 Torr as measured by a Baratron differential pressure transducer, but is typically about 225 Torr. The pressure in the inner tube can be controlled by a mechanical pump or other appropriate pump attached to the inner alumina tube through the downstream stainless steel end piece. This end piece is mechanically attached to a "water cooled" cold plate, with an adjustable temperature system, through a matching set of insulating zirconia blocks. Depending on the desired temperature range of operation, the crucibles used to contain the silicon/silicon oxide based mixtures were either commercially available quartz (1200–1350° C.) or alumina (1400–1500° C.) or were machined from low porosity carbon (1500° C.). The parameters that can be controlled in this experiment were (1) gas flow rate, (2) total tube gas pressure, (3) central region temperature and temperature gradients to the end regions, and (4) cold plate temperature. The ultra-high purity argon was not heated before it enters the inner furnace tube, although it could be heated. The condensation of silicon-based nanowires produced dark brown deposits in a narrow region on the wall of the inner alumina tube, close to the defining end points of the Lindberg oven shell, which corresponds to a temperature in the range approximately 900–1000° C. Large quantities (e.g. gram quantities) of $SiO_2$ nanospheres were deposited on the temperature controlled cold plate.

In an exemplary embodiment, virtually uniform and straight nanowires were generated from a 50/50 $Si/SiO_2$ equimolar mixture heated to a temperature of about 1400° C. at a total pressure of about 225 Torr for about 12 hours. The central crystalline silicon core for the nanowire is about 30 nm in diameter, whereas the outer $SiO_2$ sheathing is about 15 nm in thickness, as exemplified in Gole et al., Appl. Phys. Lett., 76, 2346 (2000), which is incorporated herein by reference. However, nanowires with much smaller and larger diameter central crystalline cores and different sheathing thickness have been obtained. The axis of the $SiO_2$ clad crystalline silicon nanowire core is substantially parallel to the <111> plane. This is distinct from the results obtained by Lee et al., MRS Bulletin, 36 (1999) whose wires have their axis parallel to <112> plane as they display twinning, high order grain boundaries, and stacking faults. At the Si—$SiO_2$ interface for the material obtained in the present synthesis the crystal planes are best described as {211}. The nanowires synthesized are so perfect that slight undulations of the crystalline silicon core, due to strain induced by measuring devices, can be observed.

Other distinguishing characteristics of the nanowires include the pinch off of the crystalline silicon core at the beginning of the wire growth, suggesting a distinctly different formation mechanism than that suggested by Lee et al. for their wires generated using a similar source and by Hu et al., Acc. Chem. Res. 32, 435 (1999) for their iron-catalyzed wire formation from Fe/Si mixtures generated using laser ablation. While Lee et al. find evidence for a growth mechanism along <111> with which they associate a complex process involving $SiO_2$ formation, the observed structures generated using the described thermal source likely indicate that the mechanism for these nanowires is a close analogy to the VLS mechanism, albeit with an apparent self-assembly of the silicon in the absence of a metal catalyst. Further, the outer $SiO_2$ sheath of the nanowire has significant strength. Finally, a comparison to the transmission electron micrograph (TEM) micrographs of Hu et al., which show the clear termination of their nanowires at larger-nearly spherical $FeSi_2$ nanoclusters, offers yet an additional contrast suggesting further alternate mechanisms for the wire formation. The mechanism for formation of the nanowires in the present study would appear to be distinct and possess both the attributes of the $Si/SiO_2$ reaction mechanism presented by Lee et al. and of the VLS growth method.

Nearly monodisperse $SiO_2$ nanospheres in the diameter range of 8–45 nm can be generated as a deposit in gram quantities on the cold plate of the described apparatus. Nanospheres can be generated in the same apparatus that produced the nanowires. By adjusting the flow parameters and temperature, it is possible to generate nanospheres ranging in diameter from 8–45 nm in virtually monodisperse distributions. It is possible to generate these nanospheres not only from $Si/SiO_2$ mixtures but also from SiO powders, albeit at somewhat higher temperatures.

Judicious manipulation of the high temperature system including reactant mixture stoichiometry, flow conditions (kinetics), and temperature range, may yield more than would have been previously anticipated by others skilled in the art. The results suggest that additional mechanisms which are analogs not only of the VLS mechanism on the nanoscale but also represent some crystalline silicon self-assembly may be operative. Further, Lee et al. produce a jumble of uniform $SiO_2$ coated crystalline silicone nanowires of various sizes which, when straight, have their axes parallel to <112>. These wires, however, display twining, high order grain boundaries, and defect sites (stacking faults). In contrast, embodiments of the present invention are capable of producing nanowires where the axis of the nanowire core is substantially parallel to a <111> plane, virtually defect free, and demonstrate no twining. Given the high temperature synthesis of alternate combinations of metal/metal oxide nanowire configurations, embodiments of the present invention appear to be well suited to photonic waveguide applications.

B. Nanosphere Catalysts

Still another exemplary embodiment of the present invention provides a catalytic nanosphere (e.g., metallized nanosphere) and method of preparation thereof. The nanosphere of this embodiment can be formed in a manner similar to the preparation of nanospheres described earlier and includes the same properties as those nanospheres. After the nanospheres are fabricated, the nanospheres can be metallized to form metallized nanospheres that are capable of having catalytic properties. One of many advantages of this embodiment is that the nanosphere and metallized nanosphere can be fabricated in one step rather than multiple steps, as required by present techniques in the art.

Non-limiting examples of metals from which the nanospheres can be fabricated include, but are not limited to, tin (Sn), chromium (Cr), iron (Fe), nickel (Ni), silver (Ag), titanium (Ti), cobalt (Co), zinc (Zn), platinum (Pt), palladium (Pd), osmium (Os), gold (Au), lead (Pb), iridium (Ir), molybdenum (Mo), vanadium (V), aluminum (Al), and combinations thereof. In addition, non-limiting examples of metal oxides from which the nanospheres can be fabricated include, but not limited to, tin dioxide ($SnO_2$), chromia ($Cr_2O_3$), iron oxide ($Fe_2O_3$, $Fe_3O_4$, or FeO), nickel oxide (NiO), silver oxide (AgO), titanium oxide ($TiO_2$), cobalt oxide ($Co_2O_3$, $Co_3O_4$, or CoO), zinc oxide (ZnO), platinum oxide (PtO), palladium oxide (PdO), vanadium oxide ($VO_2$), molybdenum oxide ($MoO_2$), lead oxide (PbO), and combinations thereof. In addition, a non-limiting example of a metalloid includes, but is not limited to, silicon and germanium. Further, a non-limiting example of a metalloid oxide includes, but is not limited to, silicon monoxide, silicon dioxide, germanium monoxide, and germanium dioxide. The nanospheres can range in diameter. More particularly, silicon dioxide nanospheres are amorphous, have no dangling bonds, and range in diameter from about 8–45 nanometers.

Further, the method of metallization is capable of depositing a second metal onto the nanosphere. The term "second metal" is used here to differentiate the material (e.g. metal, metalloid, or oxides thereof) that the nanosphere may be fabricated into, and refers to the metal that is deposited upon the nanosphere during a metallization process. The second metals that can be deposited during the metallization process include, but are not limited to, copper, tin, aluminum, silver, platinum, palladium, iron, cobalt, nickel, combinations thereof, and other appropriate metallization metals.

EXAMPLE 2

The following is a non-limiting illustrative example of an embodiment of the present invention that is described in more detail in Gole, et al., submitted to J. Appl. Phys., Gole et al. submitted to Chemistry of Materials, which are herein incorporated by reference. This example is not intended to limit the scope of any embodiment of the present invention, but rather is intended to provide specific experimental conditions and results. Therefore, one skilled in the art would understand that many experimental conditions can be modified, but it is intended that these modifications are within the scope of the embodiments of the present invention.

Silica nanospheres, of about a 30 nm diameter, can be prepared at elevated temperature (e.g. 800–1500° C.) from an $Si/SiO_2$ mixture. Under ambient conditions, the high population of surface hydroxyl groups on these nanospheres, confirmed by FTIR spectroscopy, is probed by decorating the surfaces of the spheres with the metal complex copper (II) acetylacetonate: $Cu(AcAc)_2$. These metal complexes are known in the art to be anchored by the surface SiOH species, and can be converted into an active catalyst by thermolysis of the ligands. The resulting monatomic copper distribution forms a selective catalyst whose conversion efficiency appears to be at least comparable to, if not better than, Cu/fumed silica described in Kenvin, et al., J. Catal. 135, 81 (1992). In contrast to the fumed silica, however, the preparation of this catalyst support is environmentally benign.

Dispersed nanospheres have been fabricated without the use of solvents and without producing byproducts, such as hydrochloric acid gas, to compromise the environment. The synthesis technique uses a mixture of silicon and silicon dioxide, heated under a flow of ultra high purity argon at elevated temperature for a specified duration. The synthesis method can produce silica nanospheres, having nearly monodisperse particle size of about 30 nm. These nanospheres, as demonstrated by high-resolution transmission electron microscopy and x-ray diffraction, are amorphous. Further, as elaborated in more detail in this example, the silica nanosphere has surface properties that demonstrate the presence of surface silanol groups (—SiOH) which can be used to sequester active Cu sites for the selective conversion of ethanol to acetaldehyde. A surface population of —SiOH groups on silica can influence the bonding of metal complexes to the surface. The loading of the metal complexes and the resulting morphology of the supported metal ions is influenced by the —SiOH groups on the surface. Silica nanospheres are contacted with $Cu(AcAc)_2$ in acetonitrile in sufficient concentration to produce silica nanospheres that contain about 3 wt % Cu. This same procedure has been used to make monatomic dispersions of Cu ions on fumed amorphous silica manufactured and commercially available from the Cabot Corporation (Cab-O-Sil™) Alpharetta, Ga.

The products of the ethanol dehydrogenation reaction depend upon the ensemble size of supported Cu ions. Isolated copper ions catalyze only the dehydrogenation to acetaldehyde whereas multiple Cu ensembles show high yields of ethyl acetate in addition to acetaldehyde. Thus, the ethanol/acetaldehyde probe reaction can be used to define the presence of monatomic dispersions of Cu ion from an examination of the product distribution.

TEM micrographs indicate that nearly monodisperse $SiO_2$ nanospheres of diameter of close 30 nm can be generated in gram quantities on the cold plate of the high temperature synthesis device described earlier. As described earlier, the apparatus includes a double concentric alumina tube combination heated to the desired temperature in a Lindberg Scientific tube furnace configuration. The inner alumina tube is vacuum sealed by two water cooled stainless steel end pieces which are attached to the alumina tube and tightly lock-press fit against custom viton™ o-rings. At one end of the furnace, ultra high purity argon enters thru the upstream stainless steel end piece and passes through a matched set of zirconia insulators to the central region of the inner tube oven. The entraining argon then flows over a crucible containing the sample mixture of interest, which is either a silicon-silica ($Si/SiO_2$) mixture or powdered silicon monoxide, at a flow rate of 100 sccm controlled a flow controller.

The total tube pressure in the inner tube can range from 200 to 650 Torr but is typically about 225 Torr. This pressure can be controlled by a mechanical pump or other appropriate pump attached to the inner alumina tube through the downstream stainless steel end piece. This end piece is mechanically attached to a water cooled cold plate, which has as adjustable temperature system, through a matching set of insulating zirconia blocks. Depending on the desired temperature range of operation, the crucibles used to contain the silicon/silicon oxide based mixtures are either commercially available quartz (1200–1350° C.) or alumina (1400–1500° C.) or are machined from low porosity carbon (1500° C.). The controlled parameters may include for example, but not limited to, (1) gas flow rate, (2) total tube gas pressure, (3) central region temperature and temperature gradients to the end regions, and (4) cold plate temperature. It is to be noted that, at least for the experimental results reported here, no attempt was made to heat the ultra high purity argon before it enters the inner furnace tube. Large quantities of $SiO_2$ nanospheres were deposited on the temperature controlled cold plate.

The Cu/silica catalysts were prepared through batch impregnation of 1 g of the silica with sufficient $Cu(AcAc)_2$ metal complex to produce a sample having 3 wt % Cu. The complex was added to 25 mL of acetonitrile solvent and allowed to reflux with stirring for 24 h. The solid was separated by filtration and dried at room temperature for 18 h. This solid was dried at 100° C. for 1 hour then placed in a microreactor tube.

The ethanol dehydrogenation reaction was completed in a micro-catalytic reactor. Prior to the reaction, the nanosphere catalyst was heated to about 350° C. for about 1 h in flowing helium, then cooled to the reaction temperature. The reaction conditions were conducted at about 330° C., 20 mL per minute of He carrier gas flow over a 100 mg bed of catalyst having a Cu loading of 3 weight percent. Five to tem pL pulses of ethanol were vaporized into the He carrier gas stream to create the reactant feed. Pulses of unreacted ethanol and the products of reaction were partitioned on a GC column and detected by a thermal conductivity detector.

The silica nanospheres have been characterized by Fourier Transform Infrared (FTIR) spectroscopy. The nanospheres were scanned just after their introduction into the sample chamber at 25° C. and 1 atm. Subsequently, the samples were evacuated to <1 milli-Torr at 25° C. and their spectrum was recorded. The nanospheres were then heated to 100, 200, and 300° C. in vacuo and their spectra were recorded under these conditions.

Under 1 atm pressure at room temperature, the sample shows a large, broad peak between 3000 and 4000 $cm^{-1}$ that is characteristic of adsorbed, molecular water. This feature decreases to a negligible level immediately upon evacuation at room temperature. This result suggests that most of the water is only weakly adsorbed to the silica nanospheres. Additional peaks are present at 1800, 1600, 1200 and 800 $cm^{-1}$. In vacuo at 25 C., a sharp peak appears at 3700 $cm^{-1}$ and a broad peak near 3400 $cm^{-1}$. When the sample is heated to 300 C. under vacuum, the peak at 3700 $cm^{-1}$ grows even sharper and the adjacent peak at 3400 $cm^{-1}$ grows smaller, demonstrating further water removal. With increased heating above 200 C., the peaks at 1200 and 800 $cm^{-1}$ at first increase and then broaden and decrease in intensity as a shift of intensity to higher frequency features is apparent.

Flame-hydrolyzed, amorphous silica shows a signature for the SiO—H vibration near 3743 $cm^{-1}$ and a broad peak near 3400 $cm^{-1}$ that corresponds to adsorbed water. Additionally, Si—O vibrations are evident at 1800 and 1600 $cm^{-1}$. It appears that the surface functional groups found on the silica nanospheres are similar to those found to be present on Cab-O-Sil™.

The effect of the Cu/silica nanocatalyst on the ethanol dehydrogenation reaction is presented in Table 1. Acetaldehyde was the only product observed. Forty five percent of the ethanol was converted over about 3 mg of Cu in the 100 mg sample of Cu/silica using the nano-silica sample. The conversion per mg of Cu in this sample is 45%/3 mg or 15% conversion/mg Cu. Compare this to the results reported by Kenvin et al. for a Cu/silica prepared from Cab-O-Sil™ and operated under similar conditions (300 C., 5.1. mg Cu ion +143 mg of silica, 15.5 mL/minute of He carrier, 1–2 L of ethanol in liquid pulses). These authors observed 25% conversion over 5.1 mg Cu for a 5.1% conversion/mg Cu. No other products were observed.

These results demonstrate that the conversion efficiency for the catalyst formed from the copper loaded silica nanospheres is at least comparable to if not better than that formed from the fumed silica (within the accuracy of the micro-catalytic technique for determining catalyst activity). Moreover, the selectivity to form acetaldehyde is the same for the two catalysts. Each solid catalyzes the single reaction to form the simple dehydrogenation product without the side reaction corresponding to ethyl acetate coupling. The absence of the ethyl acetate forming reaction shows that no large ensembles of Cu are present in either sample.

TABLE 1

SUMMARY OF RESULTS

| Species | Nanosphere mol % | Fused Silica mol % |
|---|---|---|
| EtOH | 55 | 75 |
| Acetaldehyde | 45 | 25 |
| Other products | 0 | 0 |

The results obtained using the nanospheres clearly demonstrate that only the products of mono-atomically dispersed Cu (only acetaldehyde is observed) with an apparently improved efficiency. It should be noted that the process for forming the new catalyst suggests an additional advantage in that it might replace the present technique for making fumed amorphous silica by a process that is environmentally benign. The currently applied process for making fumed silica burns silicon tetrachloride to make silica and HCl. The present embodiment, which relies on an elevated temperature synthesis involving only an $Si/SiO_2$ mixture, eliminates the need to handle silicon tetrachloride and it does not produce the hydrochloric acid gas.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method of preparing a nanowire, comprising the steps of:

providing at least one composition selected from the group consisting of: a metal composition, a metal oxide composition, end combinations thereof, wherein the metal of the metal composition and the metal of the metal oxide are selected from one group consisting of: tin, chromium, iron, nickel, silver, titanium, cobalt, zinc, platinum, palladium, osmium, gold, lead, iridium, molybdenum, vanadium, and aluminum;

exposing the composition to thermal conditions of about 800° C. to about 1500° C. and at a pressure from about 200 to 650 Torr;

vaporizing the composition while flowing an inert gas over the composition; and forming a metal oxide nanowire via a condensation reaction under non-catalytic conditions.

2. The method of claim 1, wherein the step of forming a metal oxide nanowire, comprises the step of forming a metal oxide nanowire, wherein the metal oxide is selected from the group consisting of: tin dioxide, chromia, iron oxide, nickel oxide, silver oxide, titanium oxide, cobalt oxide, zinc oxide, platinum oxide, palladium oxide, vanadium oxide, molybdenum oxide, and lead oxide.

3. A method of preparing a nanowire, comprising the steps of:

providing a composition selected from a silicon-silica mixture and silicon monoxide;

exposing the composition to thermal conditions of about 800 to 1500° C. at a pressure from about 200 to 650 Torr;

vaporizing the composition while flowing an inert gas over the composition; and forming a silicon dioxide nanowire via a condensation reaction under non-catalytic conditions and when in the axis of the silicon dioxide nanowire core is substantially parallel to a <111> plane, and wherein the silicon dioxide nanowire that is substantially free of twinning, substantially free of high order grain boundaries, and substantially free of stacking faults.

4. A method of preparing a nanosphere, comprising the steps of:

providing at least one composition selected from the group consisting: of a metal composition, a metal oxide composition, and combinations thereof, wherein the metal of the metal composition and the metal of the metal oxide are selected from the group consisting of: tin, chromium, iron, nickel, silver, titanium, cobalt, zinc, platinum, palladium, osmium, gold, lead, iridium, molybdenum, vanadium, and aluminum;

exposing the composition to thermal conditions of about 800° C. to about 1500° C. and at a pressure from about 200 to 650 Torr;

vaporizing the composition while flowing an inert gas over the composition; and forming a plurality of substantially monodisperse metal oxide nanospheres via a condensation reaction under non-catalytic conditions.

5. The method of claim 4, wherein the step of forming a metal oxide nanospheres comprises the step of forming a metal oxide nanosphere, wherein the metal oxide is selected from the group consisting of: tin dioxide, chromia, iron oxide nickel oxide, silver oxide, titanium oxide, cobalt oxide, zinc oxide, platinum oxide, palladium oxide, vanadium oxide, molybdenum oxide, and lead oxide.

6. A method of preparing a nanosphere, comprising the steps of:

providing at least one composition selected from the group consisting: of a metalloid composition, a metalloid oxide composition, and combinations thereof, wherein the metalloid of the metalloid composition and the metalloid of the metalloid oxide are selected from the group consisting of: silicon and germanium;

exposing the composition to thermal conditions of about 800° C. to about 1500° C. and at a pressure from about 200 to 650 Torr;

vaporizing the composition while flowing an inert gas over the composition; and forming a plurality of substantially monodisperse metalloid oxide nanospheres via a condensation reaction under non-catalytic conditions.

7. The method of claim 6, wherein the metalloid oxide nanosphere is silicon dioxide nanosphere having a diameter in the range of about 8 nanometers to about 45 nanometers.

8. A method of preparing a nanowire, comprising the steps of:

providing at least one composition selected from the group consisting: of a metalloid composition, metalloid oxide composition, and combinatic as thereof, wherein the metal of the metal composition and metal of the metal oxide are selected from the group consisting of: silicon and germanium;

exposing the composition to thermal conditions of about 800° C. to about 1500° C. and at a pressure from about 200 to 650 Torr;

vaporizing the composition while flowing an inert gas over the composition; and forming a metalloid oxide nanowire via a condensation reaction under non-catalytic conditions.

9. The method of claim 8, wherein the a metalloid oxide nanowire consists of a metalloid oxide selected from silicon monoxide, silicon dioxide, germanium monoxide, and germanium dioxide.

* * * * *

UNITED STATES PATENT AND TRADEMARK OFFICE
CERTIFICATE OF CORRECTION

PATENT NO. : 6,720,240 B2
DATED : April 13, 2004
INVENTOR(S) : Gole et al.

It is certified that error appears in the above-identified patent and that said Letters Patent is hereby corrected as shown below:

Column 5,
Line 19, delete "viton" and replace with -- viton ™ --.

Column 6,
Lines 58 and 63, delete "twining" and replace with -- twinning -- per the amendment to the paragraph starting on page 8, line 29.

Column 7,
Line 33, delete "The nanospheres can range in diameter" and replace with -- The nanospheres can range in diameter from a few nanometers to on the order of hundreds of nanometers. --.

Column 12,
Line 1, delete "a" and replace with -- the --.
Line 2, delete "nanospheres" and replace with -- nanosphere --.
Line 5, delete "combinatic" and replace with -- combination --.

Signed and Sealed this

Twenty-seventh Day of July, 2004

JON W. DUDAS
*Acting Director of the United States Patent and Trademark Office*